(12) United States Patent
Tsironis

(10) Patent No.: US 10,884,046 B1
(45) Date of Patent: Jan. 5, 2021

(54) CALIBRATION AND LOAD PULL METHOD FOR RF AND BASEBAND FREQUENCIES

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 129 days.

(21) Appl. No.: 16/189,404

(22) Filed: Nov. 13, 2018

(51) Int. Cl.
| | |
|---|---|
| G01R 27/28 | (2006.01) |
| G01R 27/32 | (2006.01) |
| H03H 7/38 | (2006.01) |
| G01R 35/00 | (2006.01) |
| H01P 5/04 | (2006.01) |

(52) U.S. Cl.
CPC .......... *G01R 27/28* (2013.01); *G01R 35/005* (2013.01); *H01P 5/04* (2013.01); *H03H 7/38* (2013.01); *G01R 27/32* (2013.01)

(58) Field of Classification Search
CPC .. G01R 27/28; G01R 35/005; G01R 31/2822; G01R 27/32; H01P 5/04; H03H 7/38
See application file for complete search history.

(56) References Cited

U.S. PATENT DOCUMENTS

| | | | | |
|---|---|---|---|---|
| 7,486,067 | B2 * | 2/2009 | Bossche | G01R 27/28 |
| | | | | 324/76.22 |
| 7,646,267 | B1 * | 1/2010 | Tsironis | G01R 27/32 |
| | | | | 333/17.3 |
| 8,466,758 | B1 * | 6/2013 | Tsironis | H01P 5/04 |
| | | | | 333/17.3 |
| 8,786,293 | B1 * | 7/2014 | Tsironis | G01R 27/06 |
| | | | | 324/613 |
| 9,310,410 | B1 | 4/2016 | Tsironis | |
| 9,632,124 | B2 * | 4/2017 | Simpson | G01R 29/26 |
| 10,281,510 | B1 * | 5/2019 | Tsironis | G01R 31/2822 |
| 2009/0174415 | A1 * | 7/2009 | Verspecht | G01R 35/005 |
| | | | | 324/601 |
| 2019/0086503 | A1 * | 3/2019 | Simpson | G01R 27/32 |

OTHER PUBLICATIONS

Load Pull [online], Wikipedia [retrieved on Nov. 18, 2016], Retrieved from Internet <URL:https://en.wikipedia.org/wiki/Load_pull>.
How does a slide screw tuner (frequency > 100MHz) work? [online], Focus Microwaves [retrieved on Nov. 16, 2018] Retrieved from Internet <URL: http://www.focus-microwaves.com/questions/how-does-slide-screw-tuner-frequency100mhz-work>.

(Continued)

*Primary Examiner* — Michael C Zarroli

(57) ABSTRACT

A test method allows investigating the dependence of microwave gain, power and linearity behavior of transistors, in which modulated RF signal is injected, as a function of source and load impedance at the signal RF carrier frequency and its harmonics as well as at the modulation (baseband) frequency, using passive programmable tuners. A calibration method generates data allowing the test setup to simultaneous and independent tune at RF and baseband frequencies without the need of on-line vector signal measurement. This allows optimizing baseband frequency impedances for nonlinear amplifier performance with modulated signal, such as ACPR, EVM, IMD etc. Baseband tuning is done using low frequency programmable impedance tuners inserted in the DC branch of the bias networks, which operate as frequency diplexers.

5 Claims, 6 Drawing Sheets

(56) References Cited

OTHER PUBLICATIONS

Non-linear Devices [online], Microwaves101[retrieved on Nov. 16, 2016], Retrieved from Internet <URL:https://www.microwaves101.com/encyclopedias/ non-linear-devices>.
"Base-Band Impedance Control and Calibration for On-Wafer Linearity Measurements", M.J.Pelk et al: ARFTG 2004, pp. 35-40.
Adjacent Channel Power ratio (ACPR) [online], Wikipedia [retrieved on Nov. 9, 2018], Retrieved from Internet <URL:https://en.wikipedia.org/wiki/ Adjacent_ channel_power_ratio>.
Error Vector Magnitude (EVM) [online], Wikipedia [retrieved on Jul. 22, 2008], Retrieved from Internet <URL:https://en.wikipedia.org/wiki/Error_vector_magnitude>.
Intermodulation (IMD) [online], Wikipedia [retrieved on Jul. 22, 2008], Retrieved from Internet <URL:https://en.wikipedia.org/wiki/Intermodulation>.
"Three probe tuner tackles multiple tasks", Microwaves & RF Magazine, Feb. 2005, p. 90ff.

\* cited by examiner

CALIBRATION AND LOAD PULL METHOD FOR RF AND BASEBAND FREQUENCIES

PRIORITY CLAIM

Not Applicable

CROSS-REFERENCE TO RELATED ARTICLES

1. Load Pull [online], Wikipedia [retrieved on Nov. 18, 2016], Retrieved from Internet <URL:https://en.wikipedia.org/wiki/Load_pull>.
2. How does a slide screw tuner (frequency >100 MHz) work? [online], Focus Microwaves [retrieved on Nov. 16, 2018] Retrieved from Internet <URL: http://www.focus-microwaves.com/questions/how-does-slide-screw-tuner-frequency100mhz-work>.
3. Non-linear Devices [online], Microwaves101 [retrieved on Nov. 16, 2016], Retrieved from Internet <URL:https://www.microwaves101.com/encyclopedias/non-linear-devices>.
4. Tsironis, U.S. Pat. No. 7,646,267, "Low Frequency Electromechanical Impedance Tuner".
5. Tsironis, U.S. Pat. No. 9,310,410, "Load and source pull test system for RF and baseband frequencies".
6. "Base-Band Impedance Control and Calibration for On-Wafer Linearity Measurements", M. J. Pelk et al: ARFTG 2004, pages 35-40.
7. Adjacent Channel Power ratio (ACPR) [online], Wikipedia [retrieved on Nov. 9, 2018], Retrieved from Internet <URL:https://en.wikipedia.org/wiki/Adjacent_channel_power_ratio>.
8. Error Vector Magnitude (EVM) [online], Wikipedia [retrieved on Jul. 22, 2008], Retrieved from Internet <URL: https://en.wikipedia.org/wiki/Error_vector_magnitude>.
9. Intermodulation (IMD) [online], Wikipedia [retrieved on Jul. 22, 2008], Retrieved from Internet <URL:https://en.wikipedia.org/wiki/Intermodulation>.
10. "Three probe tuner tackles multiple tasks", Microwaves & RF Magazine, February 2005, page 90ff.

BACKGROUND OF THE INVENTION

This invention relates to load pull testing (ref. 1). of microwave power transistors using automatic impedance tuners (ref. 2). The tuners are used for synthesizing independently reflection factors (impedances) and match the Device under test (DUT) at its input and output ports, both, at the signal microwave (RF) carrier frequency, including its harmonic frequencies, and at the low two tone or broadband modulation frequency (Baseband) simultaneously; DUT, in this context is, non-exclusively, a typical nonlinear semiconductor device, such as a power transistor or amplifier (ref. 3).

The traditional method for testing and characterizing transistors for high power operation is "load pull" and "source pull" (FIG. 1, ref. 1). Load pull or source pull are measurement techniques employing signal sources, RF impedance tuners (input and output) and other test equipment, such as power meters, vector network analyzers and spectrum analyzers allowing testing discrete DUT's embedded in test fixtures or chips manufactured on semiconductor wafers. Control computers recall tuner calibration data, set the tuner(s) in appropriate states allowing creating the desired impedances and retrieve measured data via GPIB or other digital communication from the auxiliary test instruments Two types of passive tuners are used in this test method: High frequency slide screw tuners (ref. 2) and low frequency LC based tuners (ref. 4). The high frequency (or RF) tuners have an absolute lowest frequency of operation of about 100 MHz, because of mechanical limitations, but operate typically above 800 MHz. Low frequency (or LF) tuners use variable capacitors and fixed lengths of coaxial cable and operate from below 5 MHz to about 150 MHz. Both tuner types are computer controlled and calibrated using vector network analyzers (VNA), the calibration data is saved on hard-disk or electronic memory and is retrieved during measurement time. Appropriate routines allow impedance interpolation between calibrated tuner states (ref. 5).

In most cases of wireless communication, the RF signal is not pure carrier wave (CW) but includes some kind of modulation, which contains the information to be transmitted. In these cases the signal spectrum spreads around the main carrier wave (RF) and the bandwidth depends on the information contained and the modulation techniques used. Modern telecommunication schemes require sidebands of several MHz up to a few dozens of MHz (ref. 5, FIG. 2). If the DUT are operated at high power in their nonlinear regime, as is the normal case, the RF upper and lower sideband frequencies are mixed down into the baseband and from there they interact with the (low frequency) DC biasing circuitry and get mixed up again into the RF signal, where they interact with the original modulation signals (ref. 5, FIG. 4). This phenomenon is difficult to control and may lead to deteriorated RF performance of the DUT. Therefore a method is required in order to study, understand, control and reduce the possible deteriorating results of this phenomenon by controlling the baseband impedance.

DESCRIPTION OF PRIOR ART

In a single case of known prior art (ref. 6) the baseband impedance is controlled using active signal injection after down-converting from the modulated RF signal using simultaneous on-line vector receiver measurement. In the present invention only passive tuners are used, which allow pre-calibration and independent synthesis of any user defined RF or baseband impedance and the associated systematic investigation of the DUT behavior under such conditions, without plugged-in vector receivers.

BRIEF DESCRIPTION OF THE INVENTION

This invention describes a calibration and test method, which allows investigating and optimizing not only as hereto (ref. 1) the RF impedances of the carrier signal seen by the DUT in the GHz frequency range, but also, simultaneously, the low frequency impedances, at baseband modulation frequency in the MHz frequency range, using an automated passive Load Pull test setup. In actual networks and test setups (FIG. 1) the baseband impedances are generated, mostly unintending, essentially by the DC biasing networks. Bias networks are, in general, not part of the amplifier design considerations, because they are supposed to separate the RF signal from the DC bias by allowing the RF signal to pass through from the signal source to the DUT with as low insertion loss as possible, while blocking the DC current using blocking Capacitors (FIG. 2), and allow the DC bias (current) to pass through the bias network to the power supply while blocking the RF signal as much as possible using Inductor chocks.

Simple and typical LC bias networks, also called Bias-Tees, are shown in FIG. 2 next to the signal source and the load and act as frequency Diplexers (separators or combiners of frequency bands): towards the power supply and the signal source the signals are separated, towards the DUT they are combined, as shown in detail A in FIG. 2. The creation of the nonlinear down and up conversion is shown in ref. 5, FIGS. 2 to 4 and described in ref. 5 column 4, lines 12 to 27.

BRIEF DESCRIPTION OF THE DRAWINGS

The invention and its mode of operation will be better understood from the following detailed description when read with the appended drawings in which:

FIG. 6A at RF frequencies and FIG. 6B at baseband frequencies.

DETAILED DESCRIPTION OF THE INVENTION

Figure 1:
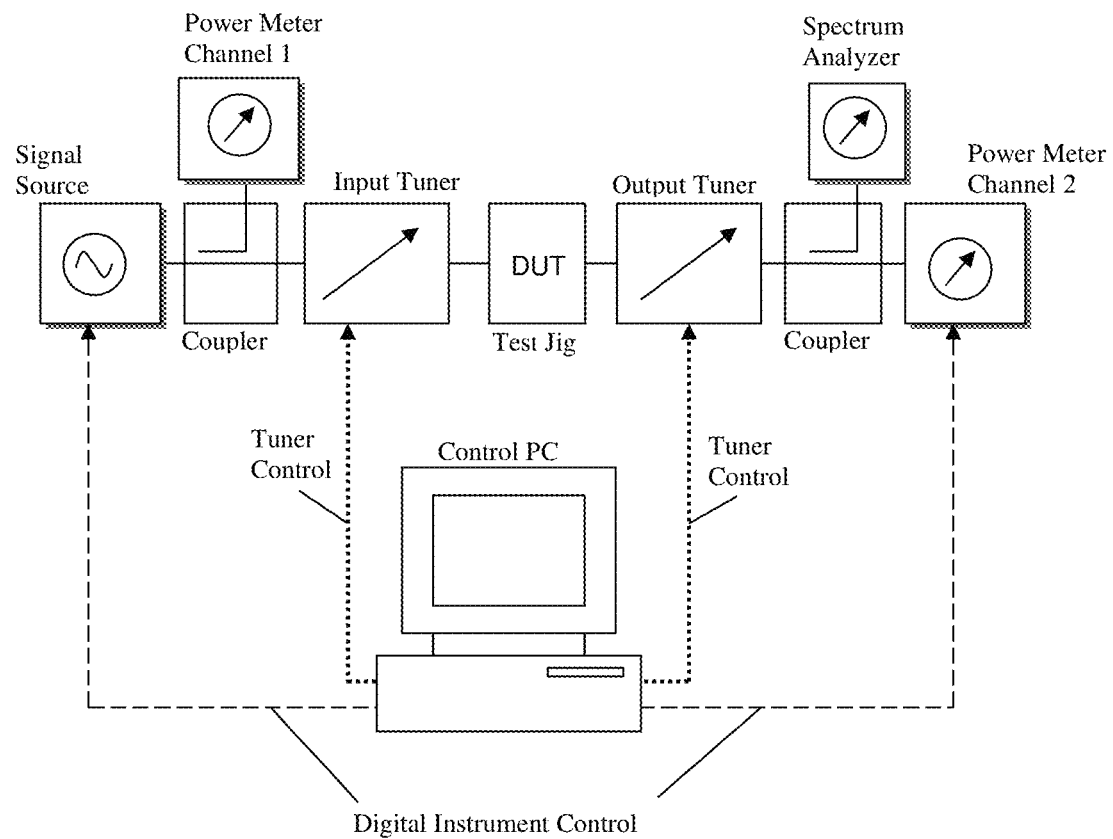
FIG. 1 depicts prior art, a typical automated radio frequency (RF) load pull test setup.
Figure 2:
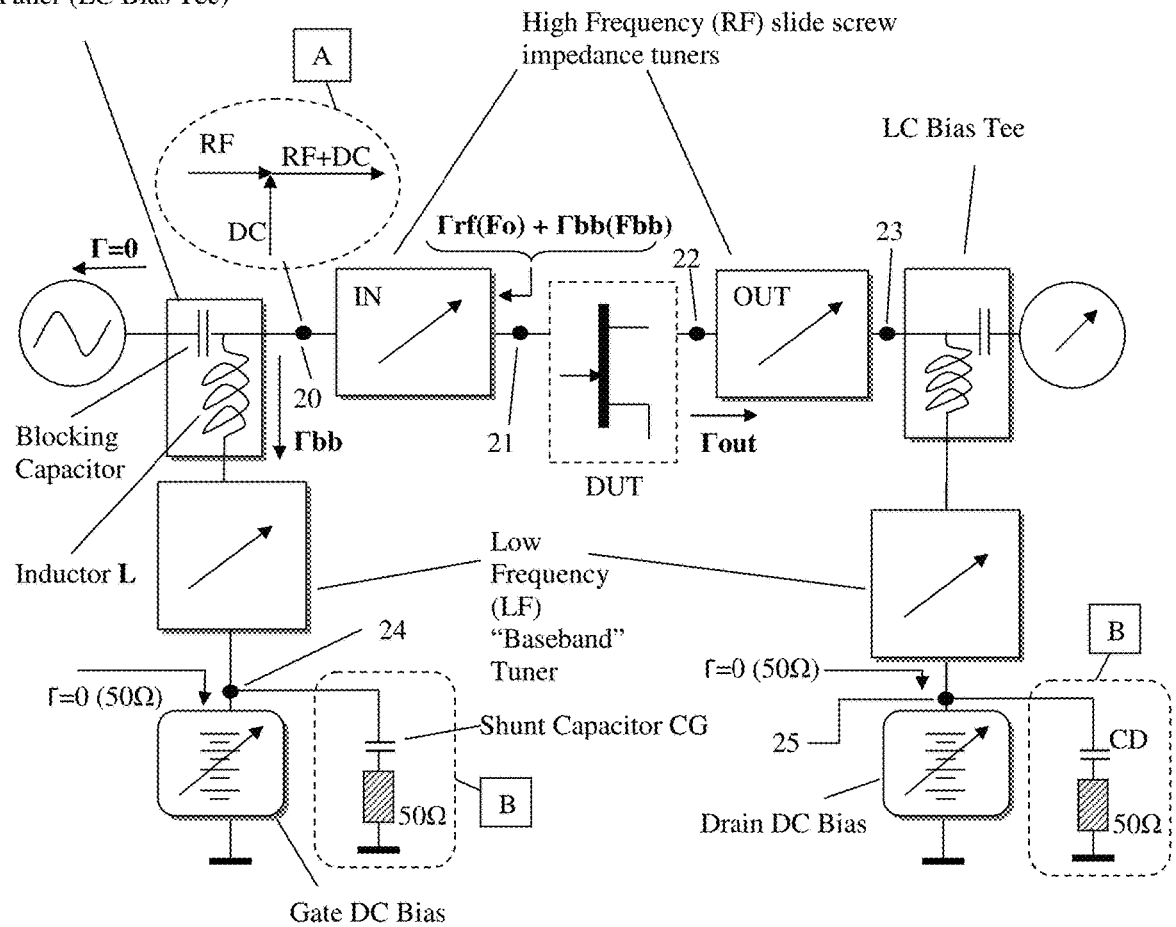
FIG. 2 depicts the RF and baseband load and source pull test setup used for the characterization method.

The test setup for the RF and baseband frequency load pull uses DC (direct current) LC-based Bias-Tees as frequency Diplexers (or DC from RF signal separators) shown in FIG. 2. The Bias-Tee comprises a series capacitor C that represents an open circuit for DC and low frequencies and a shunt inductor L that blocks RF signals and lets DC and low frequency signal pass through. This allows RF frequencies to pass through from the signal source to the DUT with very low insertion loss. The DC-blocking capacitor of adequate size is inserted in the signal path to stop the DC current and allow the RF signal to pass. The DC path is blocked for the RF signal by a chock inductor L (FIG. 2). The DC gate and drain bias supplies are connected to the inductors and have undetermined internal impedance; in this setup however the internal impedance of the power supply branches shall be 50Ω (Γ=0), in order to facilitate the baseband tuning operations. This is materialized by connecting a parallel branch of high value (several micro-Farad) shunt capacitors CG (for Gate terminal) and CD (for Drain terminal of the DUT) to the DC power supply terminal 24 and 25 followed by 50Ω resistor. This will allow the baseband signal to "see" 50Ω independently on the internal impedance of the DC power supply. The Bias-Tee inductor L and following power supply and access cables represent a non-negligible impedance at baseband frequencies up to around 20 MHz. This impedance is connected in parallel to the DUT input and output terminals and has, in many cases, a deteriorating effect on the nonlinear behavior of the DUT, due to the down-and-up converted modulation signals, as shown in ref. 5, FIGS. 2 to 4. This undesired and hitherto poorly controllable phenomenon appears when large modulated signals are injected into a nonlinear DUT.

The test setup described here allows controlling the baseband impedance Zbb (or reflection factor Γbb as shown in FIG. 2 next to node 20), which is presented to the device, and optimizing its performance concerning modulation-related characteristics such as Adjacent Channel Power Ratio (ACPR) (ref. 7), Error Vector Magnitude (EVM) (ref. 8), Inter-modulation (IMD) (ref. 9) and more. Up to now controlled baseband impedance-mapping of those quantities using passive, pre-calibrated tuners has not been reported.

FIG. 2 serves also for identifying the various impedances Z and reflection factors 1, present at the DUT input and output ports at the different interfering frequencies. Hereby the relation between reflection factor and impedance is: $\Gamma=(Z-Zo)/(Z+Zo)$ and $Zo=50\Omega$; the RF frequencies present are the modulated carrier frequency (Fo) of the injected signal and its harmonics N*Fo: 2Fo, 3Fo . . . , which are created by the nonlinear DUT; the baseband frequency is the modulation frequency of the carrier signal Fbb. Looking towards the signal source through the blocking capacitor we see 50Ω (or Γ=0) at the RF signal frequency (Fo), because the typical broadband internal impedance of the signal source is 50Ω and the blocking capacitor is large enough to let the RF signal (Fo) through, presenting an impedance $|Zc|=1/(2*Fo*C)$; but we see an open circuit at the baseband frequency (Fbb), because the value of the blocking capacitor is not large enough to let the low frequency Fbb to pass through; the approximate ratio Zc(Fo)/Zc(Fbb)=Fbb/Fo≈1000:1. Looking into the inductor (L) of the input bias tee, on the other hand, we see a high impedance at Fo but a small impedance $|Z|=2\pi*Fbb*L$ at the baseband frequency; because of the relatively small value of the inductance (L) and the low frequency Fbb we also see through the inductor L the impedance of the baseband tuner; the above impedance ratio is valid but inverse. The baseband tuner in series with the inductor L creates a baseband reflection factor Γbb, which is controlled by the pre-calibrated baseband, low frequency LC tuner.

Looking from the DUT's input port 21 into the input (IN) RF tuner we see the parallel network of the input tuner RF impedance at RF signal frequency (Γrf or Zrf) and, through the inductor L at low (baseband) frequencies the reflection factor Γbb or Zbb generated by the baseband tuner. This is possible, because the input tuner used is a slide screw tuner which reflects high frequencies only and is transparent at low frequencies, since it is based on a low loss transmission line.

By controlling both reflection factors Γrf and Γbb independently, using the RF tuner (which can be a single probe wideband tuner, ref. 2, or a multi-probe harmonic tuner, ref. 10, and the LF tuner, ref. 4) one can then investigate the effect of such tuning on the RF and baseband related DUT characteristics such as Gain, Efficiency, but also ACPR, EVM and IMD as a function of any combination of impedances/reflection factors at Fbb, Fo, 2Fo, 3Fo as a stimulus parameter and optimize the ACPR, EVM, IMD accordingly. This procedure is outlined in detail in the flowcharts of FIGS. 3 and 4. Once the optimum network impedance conditions have been found, a corresponding RF and baseband network can be designed and manufactured using commercially available circuit synthesis algorithms and design software.

Figure 5:
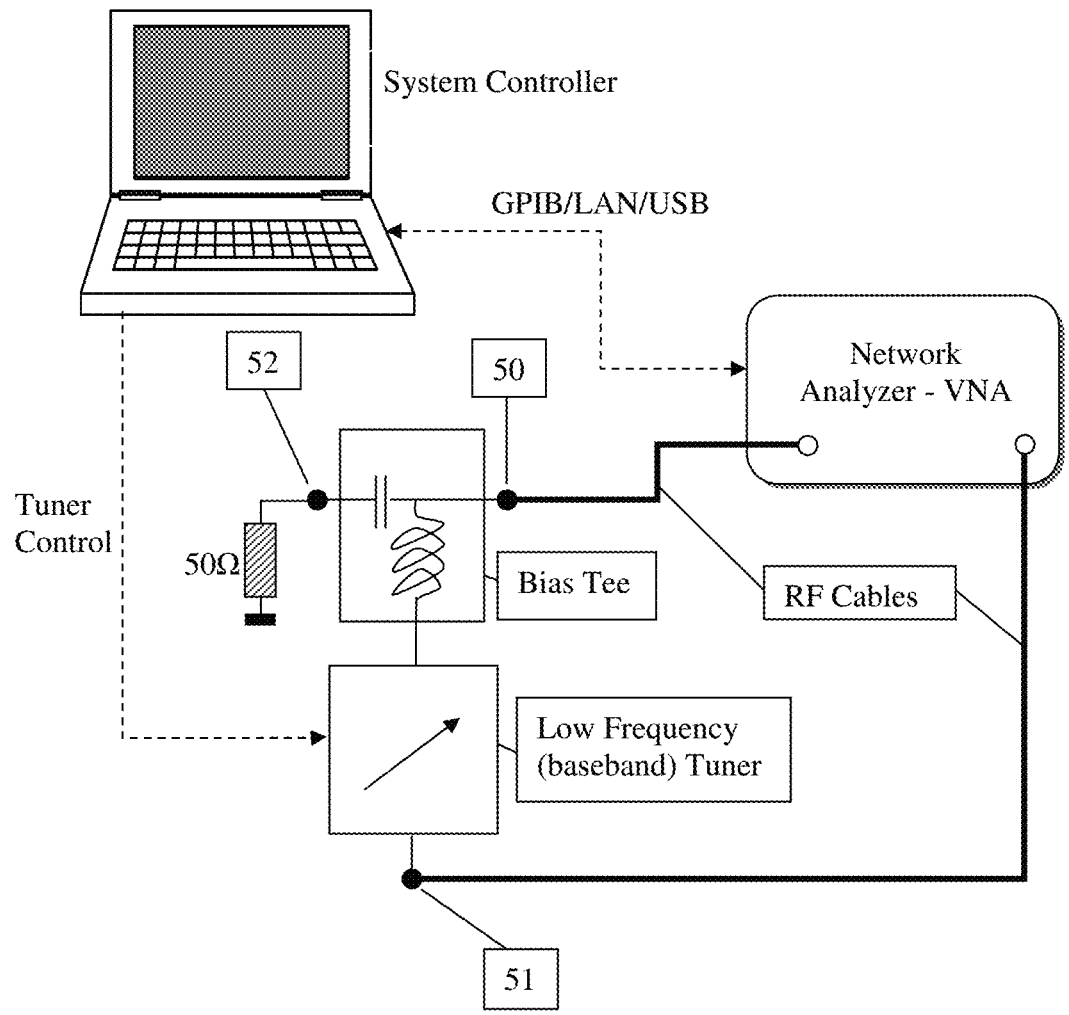
FIG. 5 depicts a calibration setup for low frequency (baseband) tuning network, which includes the Bias Tee and the low frequency tuner. RF tuners and components are calibrated by connecting the RF cables 50 and 51 directly to their input and output ports.

The measurement and mapping procedure of DUT behavior as a function of the combined RF and baseband frequency impedances includes two major steps: In a first step both RF tuners are calibrated. This is made by connecting the tuners at their in- and output ports (20 and 21, resp. 22 and 23) to a pre-calibrated vector network analyzer (VNA), positioning the reflective tuning probes to various positions along and inside the slabline, measuring the 4 s-parameters of the tuner two-ports and saving the data (ref. 2). Probe positions are, preferably, selected such as to create a reflection factor grid covering a maximum area of the Smith chart at the selected frequency. The grid comprises a high number of points, such as 1400 points, ensuring high resolution tuning. Measurement can be executed by selecting only part of the points (coarse grid) or all points (fine grid) in a certain area. The low frequency tuning branch is defined between the nodes 20 and 24 considering that the blocking capacitor represents an open circuit for baseband frequencies; it includes the inductor L, the low frequency tuner and the bypass attached 50Ω load of the gate or drain power supply. This branch is calibrated as shown in FIG. 5, by connecting nodes 50 and 51 to the VNA using flexible RF cables, measuring s-parameters for a multitude of baseband LC tuner states, selected for creating a fine grid of reflection factor points, and saving in data files for the baseband frequencies (Fbb). A selection of those points around a small target area can be included in a fine measurement grid or a selection of fewer points covering a larger area can be defined as a coarse grid. Node 52 is terminated with 50Ω to emulate the effect of the signal source in FIG. 2. The effect of the 50Ω internal impedance of the gate and drain power supplies is represented by the internal impedance of the VNA test port at node 51. DC power supplies have, normally, unknown internal impedance; we chose to adapt those to 50Ω, in order to be able to calibrate and use the baseband tuners the traditional (two-port) way between ports 50 and 51, (see FIG. 5); if the internal impedance of the DC power supplies were uncontrolled, then port 51 in FIG. 5, would not correspond to the real network and the baseband tuner calibration would comprise different reflection factors at port 50 and reliable tuning covering the entire Smith chart at baseband frequencies might become impossible. Such 50Ω conversion at the gate and drain power supplies for baseband frequencies uses high value shunt capacitors followed by 50Ω resistor, connected between nodes 24 and 25 and ground (detail B in FIG. 2) and then the reflection factor presented to the DUT at Fbb becomes: $\Gamma bb=S11_{bb}$, whereby $Sij_{bb}$ are s-parameters of the low frequency tuner at Fbb measured as shown in FIG. 5 between nodes 50 and 51.

Figure 6A:
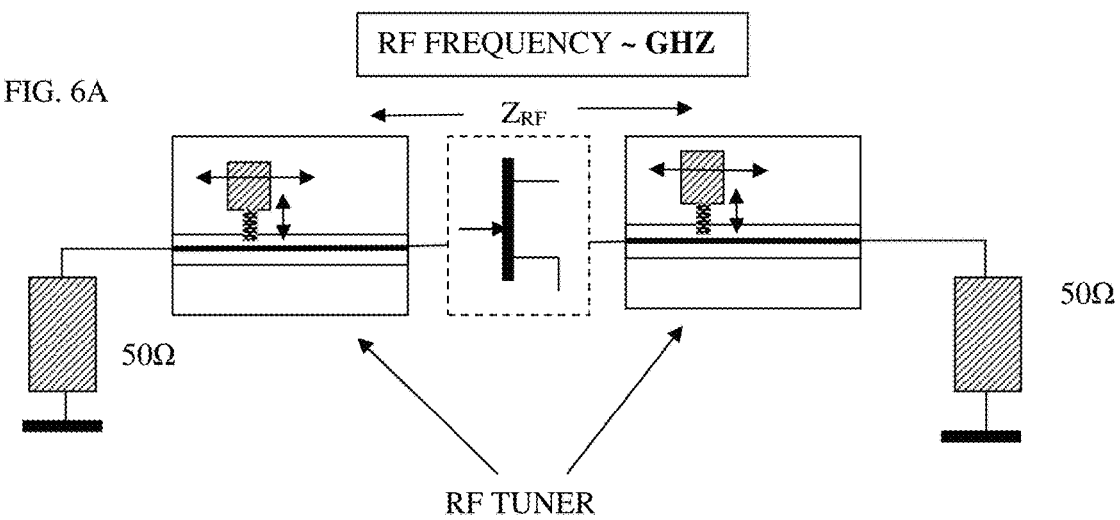
FIG. 6A through 6B depict electrical equivalent circuits of the test setup.
Figure 6B:
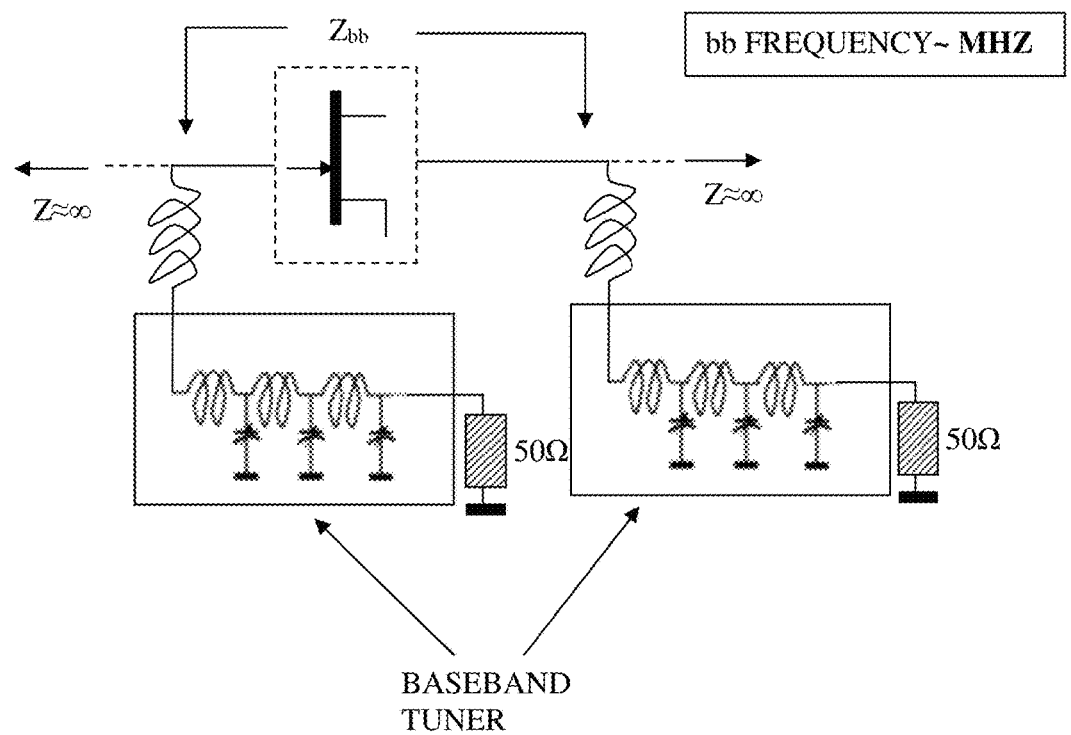

In a next step the remaining components of the test setup are calibrated by measuring their s-parameters using the VNA, saving and numerically cascading before measurement operations in order to properly shift the reference plane to the DUT terminals and correct for insertion loss. An obvious difficulty in understanding the setup and the operation is the fact that, the same physical components in FIG. 2 serve differently in each frequency band. This is clarified in FIG. 6. At RF frequencies in the GHz frequency range the DUT "sees" only the RF tuners (FIG. 6A). The baseband tuners are blocked by the inductor in the bias tees. Only the RF tuners manipulate the impedances. However, the baseband frequencies are always present, but not affected by the RF tuners, which at those frequencies are simple low loss transmission lines (slablines, even if the tuning probes are inserted). The baseband frequencies, instead, traverse freely the inductors in the bias tees (FIG. 6B) and are manipulated by the attached low frequency tuners. Instead the blocking capacitors of the bias tees (FIG. 2) block the baseband frequencies and the DUT does not "see" the 50Ω loads at the input and output, which would, otherwise, connected in parallel, limit the tuning range of the baseband, low frequency, tuners.

This invention discloses two load pull test methods: a "real time" method A and a "data post-processing" method B. The real time method A uses real time search and optimization algorithms, whereby the DUT characteristics are measured and in real time the source and load RF and baseband impedances are tuned to target objectives. The interdependence between characteristics requires a number of iteration loops alternative between tuners, such as RF tuners first and baseband tuners next. If baseband tuning alters the DC bias conditions of the DUT, then RF tuning iterations must be repeated. Data post-processing is, in general, not part of this method. The data post-processing method B comprises measuring and saving data at all impedance permutations and post-processing the data to obtain an optimum. To avoid a very large number of permutations the method executes in two steps, using a coarse tuning grid to tune roughly in the area of the optimum, named here method B1, followed by measuring over a fine tuning grid around the optimum, named here method B2. This radically reduces the number of permutations and thus measurement time.

Figure 3:
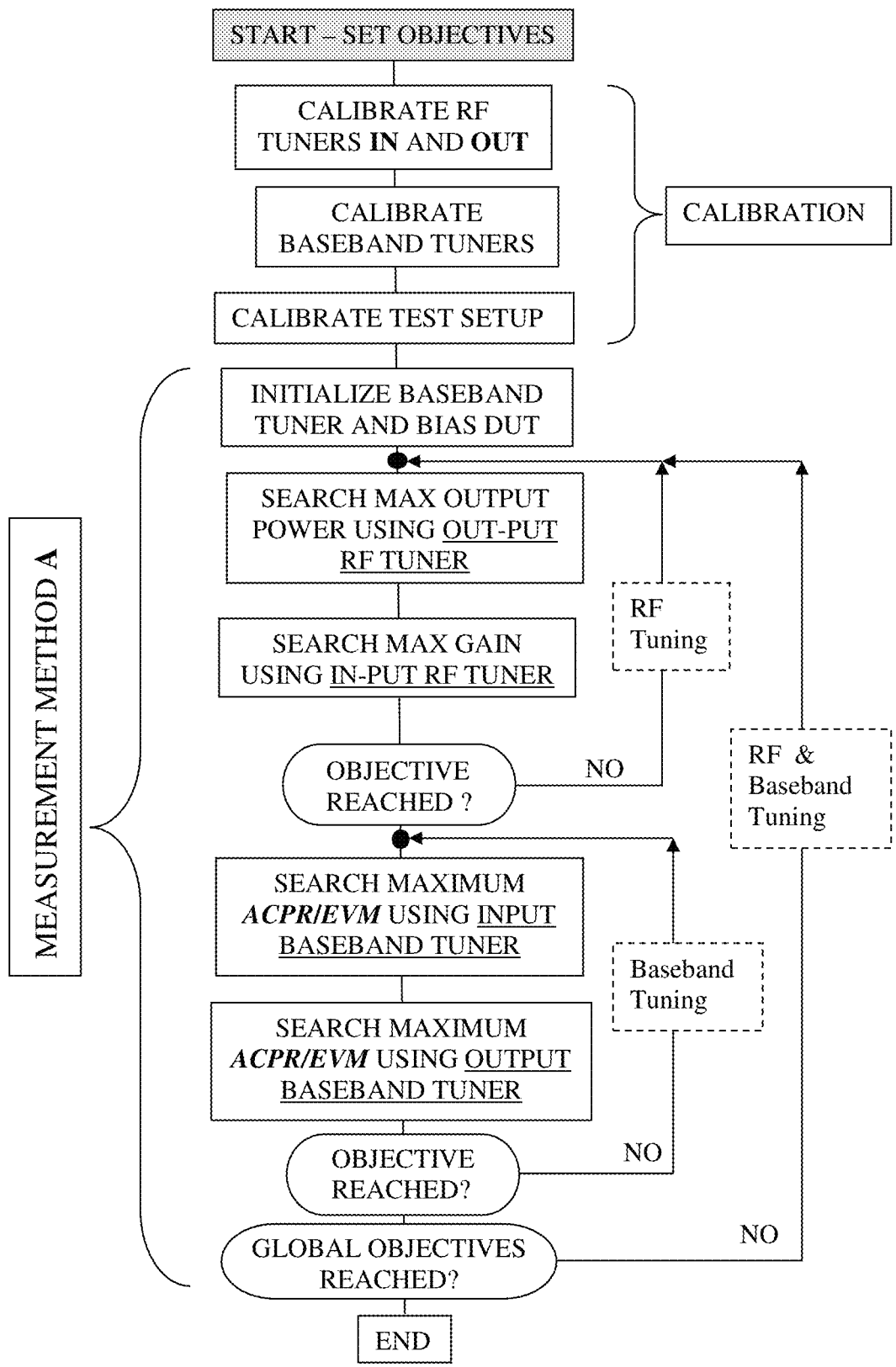
FIG. 3 depicts the calibration and "data poet-processing" test procedure flowchart.

After calibration, the method A test procedure starts by initializing the baseband tuner and searching the optimum output power or gain at RF frequencies using the input (IN) and output (OUT) RF tuners (FIG. 3). After the RF optimum is reached the procedure enters the baseband frequency optimization. Using the input and output (if available) baseband tuners the search optimizes the modulated signal-associated quantities (ACPR, EVM, IMD . . . ). Once this objective is reached the whole cycle, starting with Gain etc. optimization using RF tuners, is repeated employing smaller steps in RF and baseband tuning. The procedure terminates if the cycle does not yield further improvements relative to the totality of the objectives set. It needs to be noticed that RF Gain and Power may be compromised for reaching higher ACPR/EVM/IMD objectives. Setting such objectives or limits is the responsibility of the test engineer. Time needed for method A depends strongly on the starting point of search.

Figure 4:
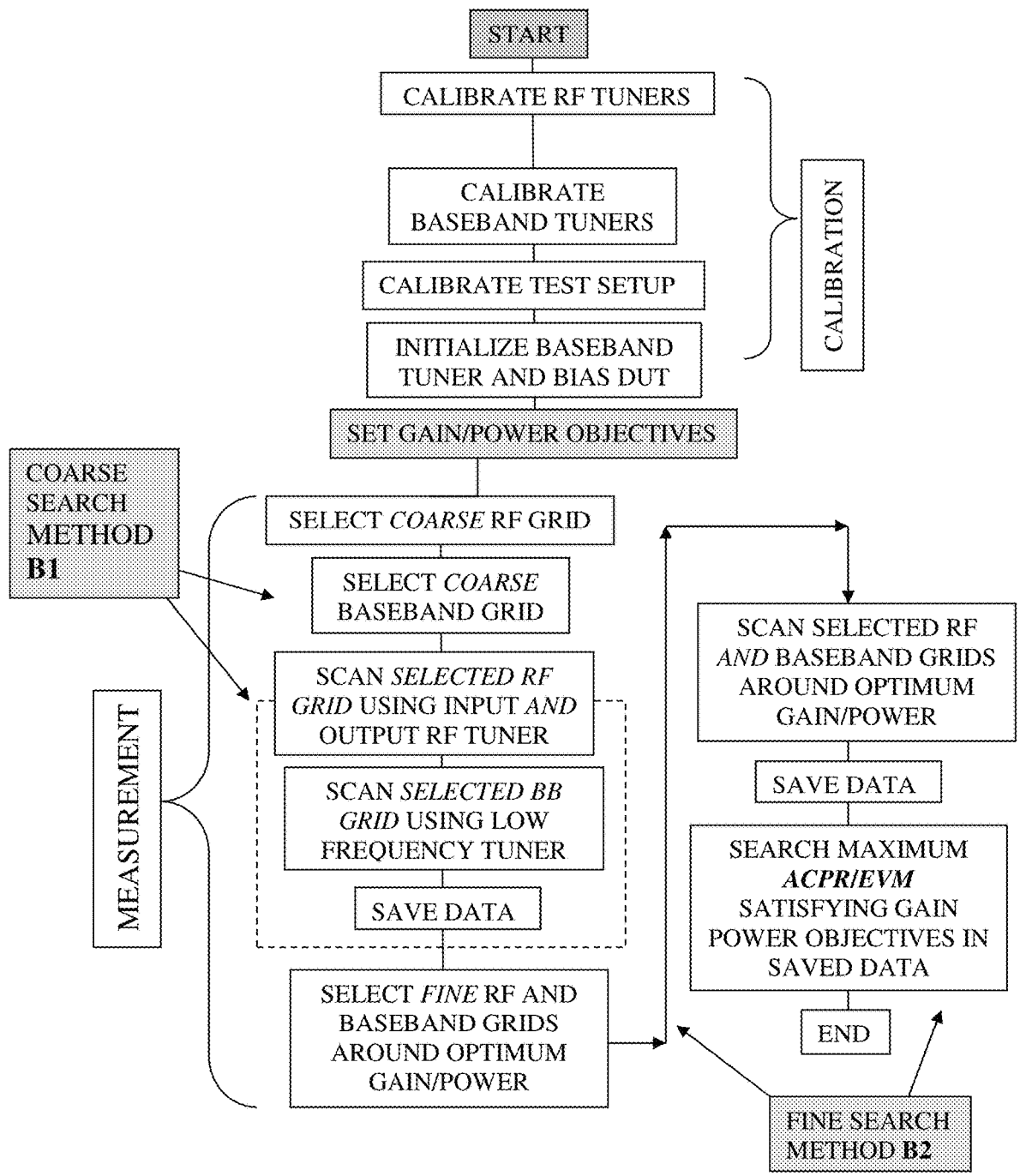
FIG. 4 depicts the calibration and "real-time" test procedure flowchart; it is noted that after calibration the test system is autonomous, not requiring on-line impedance measurements like any active system; "scan" hereby means "measuring DUT characteristics for a set of reflection factors".

The data post-processing alternative, method B, is shown in the flowchart of FIG. 4; it consists of systematically scanning all possible permutations of impedances at RF and baseband frequencies, first using a coarse tuner state grid for both RF and baseband tuners, method B1, setting the tuners to the best states found in the coarse grid, and continue using a fine grid around the previously found states, and scanning all available tuner state permutations in the fine grid, method B2, while measuring the DUT performance. Then saving all data and selecting solutions for the quantity to optimize (Gain, Power, ACPR, EVM, etc.) or combinations thereof, numerically by searching through the full data base. This method is possible but can also be time consuming. It is easy to estimate that a coarse grid of 17 points per tuner (3 reflection factor levels every 45 degrees) would require testing around $17^3 \approx 5000$ points and an additional 10-point fine grid another 1000 points.

RF harmonic impedances are investigated by replacing wideband single probe fundamental frequency RF tuners by multi-probe harmonic tuners (ref. 2), allowing independent investigation of the effect of harmonic impedances at 2Fo, 3Fo etc. These can be added, in both the real time method A and the data post-processing method B; in both cases the number of iterations may increase dramatically and requires preparatory tests and proper impedance grid selections for calibration and measurement.

The results of the test procedures are collected and saved in the general format of ACPR or EVM or IMD as a function of Γrf(Fo), Γbb(Fbb), Γout(Fo), Γout(Fbb), whereby rout is the reflection factor presented to the DUT output port at RF and baseband frequencies (if the low frequency tuner is included in the output branch). Appropriate mapping of all dependencies shall allow either during the test procedure or post processing identifying the optimum networks for the objectives set. The criterion for further improving the DUT performance consists in: (a) plotting all the results graphically and deciding if there is margin for improvement or (b) changing slightly the state of each tuner in RF or baseband frequencies and observe the DUT performance. This can be done either manually by trial and error, or using scripts suitable for search routines. The procedure is delicate, because of the multitude of parameters involved and their interdependence.

Although the present invention has been explained hereinabove by way of a preferred embodiment thereof, it should be pointed out that other combinations of the described measurement steps are possible and, as far as obvious to a person skilled in the art, they shall not limit the scope of the present invention.

What I claim as my invention is:

1. Calibration procedure of load pull test setup using a pre-calibrated vector network analyzer, wherein;
    the load pull test setup comprises
        a modulated signal source, a device under test (DUT), input and output radio frequency (RF) impedance tuners inserted in a RF path, and low frequency (LF) impedance tuners inserted in a direct current (DC) path, input and output bias tees having RF and DC path, and measurement instruments;
    the calibration procedure comprises
    a) measuring scattering (s-) parameters at RF and LF, of the input and output RF tuners by placing the RF tuning probes at a multitude of positions creating a reflection factor pattern at a frequency Fo covering an area of the Smith chart, and saving;
    b) measuring s-parameters at RF and LF of the input and output LF tuners, inserted in the DC path of the bias tees, by placing the capacitors at a multitude of settings and saving;
    c) measuring s-parameters of the remaining components of the setup at RF and LF and saving;
    d) cascading s-parameters of steps a) to c) and saving.

2. Real-time measurement procedure using data as in claim 1, comprising
    a) initialize the LF tuners (turn all capacitors to minimum) and the RF tuners (withdraw the RF tuning probes);
    b) DC bias the DUT and inject RF signal power;
    c) search, at Fo, for maximum Gain of the DUT using the input and output RF tuners;
    d) leave input and output RF tuners at the state of step c) and search for highest adjacent channel ratio (ACPR), or lowest error vector magnitude (EVM), using the input and output LF tuner;
    e) save Power, Gain, ACPR or EVM data and the associated impedance data of the RF and LF tuners.

3. Post-processing measurement procedure, using data as in claim 1, comprising
    a) select coarse reflection factor pattern for RF and LF and initialize the LF tuners (turn all capacitors to minimum);
    b) scan through all permutations of the coarse pattern of RF input and output reflection factors using the RF tuners, measure and save DUT characteristics;
    c) search though the data of step b), determine the reflection factors for optimum DUT characteristics and set the tuning probe(s) of the RF tuners to the associated positions;
    d) scan through all permutations of the coarse pattern of LF input and output reflection factors using the LF tuners, measure and save DUT characteristics;
    e) search though the data of step d), determine the reflection factors for optimum DUT characteristics and turn the capacitors of the LF tuners to the associated settings;
    f) repeat steps a) to e) for fine patterns of reflection factors at RF and LF around the reflection factors found in steps c) and e);
    g) save the DUT characteristics, RF and LF reflection factors found in step f).

4. The method of claim 1 or 2 or 3, wherein the RF impedances comprise impedances at the carrier frequency (Fo) and its harmonics (2Fo, 3Fo . . . ),
    and wherein
        the RF tuners are multi-probe harmonic tuners.

5. The method of claim 1, wherein the DUT is mounted in a test fixture and the bias-tees are integrated into the test fixture.

* * * * *